United States Patent
Wolter et al.

(10) Patent No.: US 6,448,860 B1
(45) Date of Patent: Sep. 10, 2002

(54) DEVICE FOR CONVERTING SMALL CURRENTS IMPRESSED AT THE INPUT OF THE DEVICE BY A NON-IDEAL ELECTRIC SOURCE OF CURRENT INTO VOLTAGE SIGNALS

(76) Inventors: Klaus Wolter; Dieter Henke, both of Friedrich-Wilhelm-Strasse 32, 40625 Düsseldorf (DE)

( * ) Notice: Subject to any disclaimer, the term of this patent is extended or adjusted under 35 U.S.C. 154(b) by 0 days.

(21) Appl. No.: 09/485,395
(22) PCT Filed: Aug. 11, 1998
(86) PCT No.: PCT/EP98/05082
§ 371 (c)(1),
(2), (4) Date: Aug. 9, 2000
(87) PCT Pub. No.: WO99/08377
PCT Pub. Date: Feb. 18, 1999

(30) Foreign Application Priority Data

Aug. 12, 1997 (DE) .......................... 197 34 760

(51) Int. Cl.⁷ ............................... H03F 3/08
(52) U.S. Cl. ............ 330/308; 250/214 A; 250/214 AG; 330/110; 330/282; 330/289
(58) Field of Search ................. 330/110, 308, 330/289, 282; 250/214 A, 214 AG

(56) References Cited

U.S. PATENT DOCUMENTS

| | | | | |
|---|---|---|---|---|
| 4,420,724 A | * | 12/1983 | Owen | .......................... 330/277 |
| 4,602,172 A | * | 7/1986 | Kikuchi | ....................... 307/494 |
| 4,710,727 A | * | 12/1987 | Rutt | ............................ 330/110 |
| 4,939,475 A | * | 7/1990 | Prasse et al. | ................. 330/59 |
| 5,592,124 A | * | 1/1997 | Mullins et al. | ............. 330/308 |
| 6,114,686 A | * | 9/2000 | Funahashi | ................... 330/308 |
| 6,140,878 A | * | 10/2000 | Masuta | ....................... 330/308 |

OTHER PUBLICATIONS

Cennini et al. "A wideband bipolar transimpedance preamplifier for optical receiver" Nuclear Instruments and Methods in Physics Research A317 (Jun. 1992) pp. 308–322.*

* cited by examiner

Primary Examiner—Michael B Shingleton
(74) Attorney, Agent, or Firm—Proskauer Rose LLP

(57) ABSTRACT

A device for converting low currents, applied by a non-ideal current source to an input of the device, into voltage signals comprises a converter for converting the low currents into voltage signals, at least one feedback branch, and a coupler. The output of the converter is fed back to an input of the converter by the feedback branches and the coupler. The coupler is wired so that control currents supplied by the feedback branches are applied to the input of the converter via the coupler to control the low currents applied by the non-ideal current source at the input of the device. The control currents are applied to the input of the converter via the coupler with a reduction of capacitive, inductive, and ohmic influence of the feedback branches and with an amplitude matching of the control currents.

14 Claims, 7 Drawing Sheets

DEVICE FOR CONVERTING SMALL CURRENTS IMPRESSED AT THE INPUT OF THE DEVICE BY A NON-IDEAL ELECTRIC SOURCE OF CURRENT INTO VOLTAGE SIGNALS

BACKGROUND OF THE INVENTION.

The invention relates to a device for converting small currents impressed at the input of the device by a non-ideal source of current, into voltage signals, comprising a converter for transforming the small currents into voltage signals.

Devices for converting small current signals into voltage signals are known from practical application, for example from Hewlett Packard: "Optoelectronics Designer's Catalog", U.S.A. 5091-4573E (6/93) pages 5-32; 5-36; 566; 5-123. This document shows various circuits by which current signals which are provided by a source of current comprising a photo diode can be converted into voltage signals for further application.

However, with the currents provided by sources of signal current with non-ideal components it is not possible to generate voltages which meet the requirements of certain applications by a current-voltage conversion without further treatment. In addition the currents of any circuit elements that may additionally be used have a disturbing influence on the voltage signal issued.

SUMMARY OF THE INVENTION

It is the object of the invention to provide a device with which conversion into voltage signals of small current signals, generated by a source of current with non-ideal components in which the non-ideal components of the source of current to a large extent have no effect on the useful signal, and at the same time any disturbing influence of further currents used for controlling the circuit is minimized.

According to the invention, with a device of the type mentioned in the introduction, this object is met in that the output of the converter is fed back to the input of the converter by means of at least one feedback branch and a coupler, with the coupler being switched in such a way that the control currents, provided by the feedback branch of which there is at least one, to control the small currents impressed by the non-ideal source of current at the input of the device, can be coupled in at the input of the converter by means of the coupler with reduced capacitive, inductive and ohmic influence of the feedback branches as well as adjusted amplitudes of the control currents.

One advantage of the device according to the invention is that by feeding back the output signal of the device to the input by way of the coupler, the influence of the non-ideal components of the source of current to the signal current can be compensated. Where present, the currents of the feedback branches are switched directly to the input by coupling. In this, the coupler is configured in such a way that the current emanating from the source of current can be applied to the input of the device controlled by the control currents of-the feedback branches. As a result of the amplification function of the coupler with an amplification factor smaller than 1, in particular large control currents, easier handling and larger tolerances in the components used become possible.

In a preferred embodiment, one of the feedback branches of the device comprises an amplification back-coupler for setting the amplification of the circuit and for compensating for the effects of non-ideal components of the source of current in the input current. With such an amplification back-coupler, parasitic influence factors of the feedback branch can be minimized. Likewise, by the amplification back-coupler providing a compensation current, the voltage swing at the input of the device can be minimized.

Also of advantage is an embodiment in which an operating-point setting device/temperature drift compensator is provided in one of the feedback branches, which makes it possible to adjust the operating point across the entire temperature range. In this way it is possible not only to provide once-only adjustment of a static operating point, which is irrespective of the useful signal, but also to compensate in a continuous manner for the drift in the work point caused by temperature changes of the components used.

A further advantageous embodiment of the device according to the invention has a signal swing limiter in one of the feedback branches, for reducing the amplification of the device and for limiting the signal swing at the input of the device. In this, the threshold for applying the effect of the signal swing limiter is determined in such a way that is commences later than the amplification back-coupler. By limiting the signal swing, overloading the device is avoided, and by limiting amplification, the effects of the non-ideal components of the signal current source are minimized.

With a few additions, the device according to the invention can be used to particular advantage for "10 Base T", "100 Base T" or gigabase applications.

Apart from the additions which are necessary to obtain the differential current signal required for "10 Base T" applications, an adaptation for "10 Base T" applications may also provide as an interface a connecting unit which enables simple changing between PC and network distributor by changing the plug position. In addition, by a respective switching of the pins in the connecting unit, the necessity for an additional supply connection can be avoided if the supply voltage is provided by way of the plug-connection of the device according to the invention which is not used for the differential current signals for the "10 Base T" application.

But the use for other applications too, such as profibus, interbus etc. is possible by means of additions corresponding to the requirements of the particular application.

Further advantageous embodiments of the invention are disclosed in the subordinate claims.

BRIEF DESCRIPTION OF THE DRAWINGS

Below, the invention is illustrated in more detail by means of exemplary embodiments, with reference to the drawings, as follows.

DETAILED DESCRIPTION OF THE INVENTION

Figure 1:
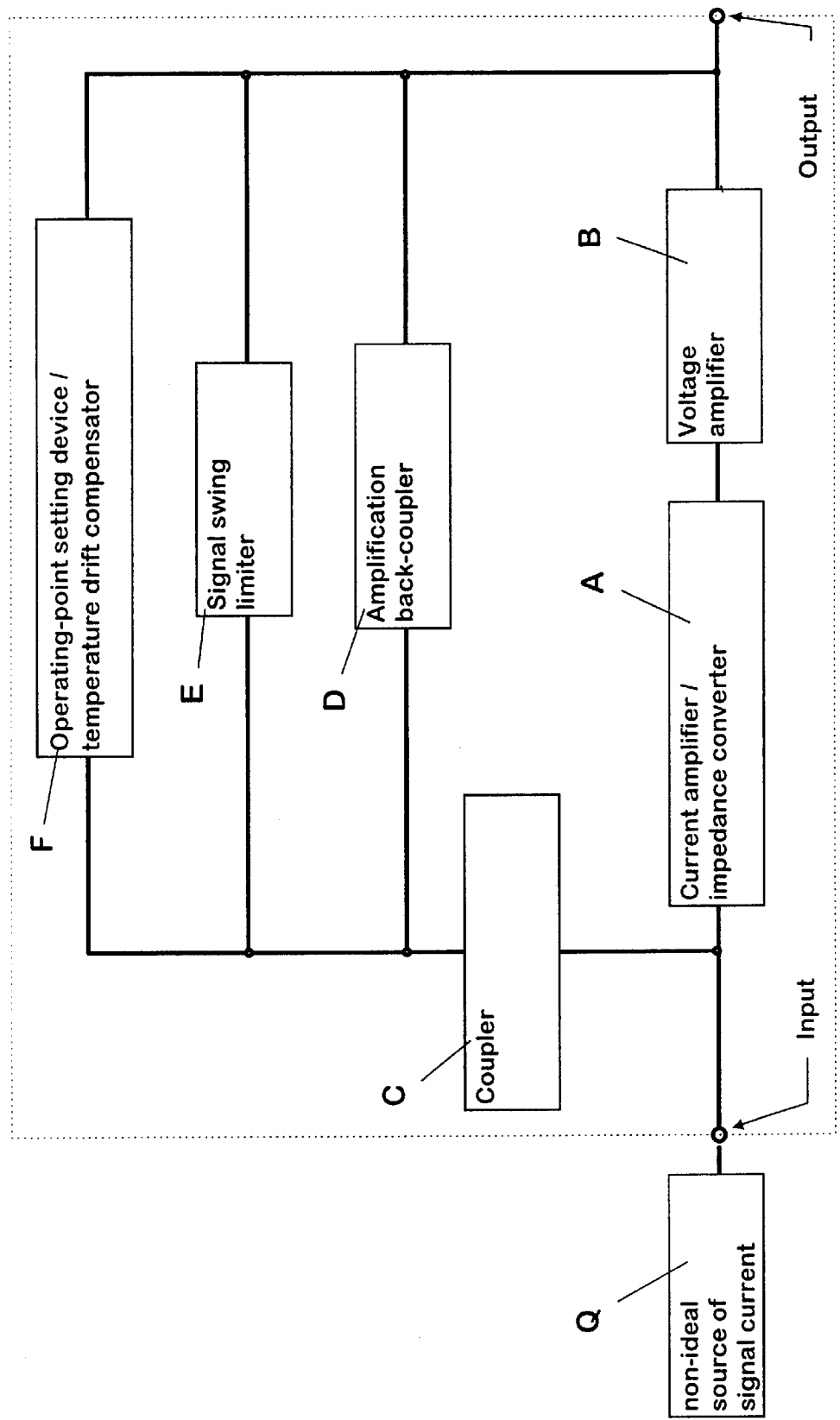
FIG. 1 is a block diagram of a first embodiment according to the invention.

FIG. 1 shows a block diagram of a device for converting small current signals into voltage signals which at its input is connected to a non-ideal signal current source Q.

A current amplifier and impedance converter A and a voltage amplifier B are switched in series between the input and the output of the device. From the output of the voltage amplifier B there is feedback to the input of the current amplifier and impedance converter A via three functional blocks parallel to each other: firstly via an amplification back-coupler D, secondly via a signal swing limiter E and finally via an operating-point setting device/temperature drift compensator F. All three functional blocks D, E, F are connected with the input of the current amplifier and impedance converter A via a common coupler C.

The source of current Q supplies a small non-ideal signal current to the device. Subsequently, the signal current is amplified by the current amplifier and impedance converter A and matched to the input impedance of the following voltage amplifier B.

The voltage amplifier B in turn, which is constructed as an inverting unit, converts the current signal into a voltage signal.

By way of its conductivity, the amplification back-coupler D regulates the amplification of the voltage amplifier a supplied with current. As an input signal it receives the output signal of the voltage amplifier B with the input signal being processed to a control current and fed back to the input via the coupler of the control currents C in such a way that parasitic influencing variables of the feedback branch are minimized.

At the same time, the equilibrium stat of the device can be dynamically maintained even if the input signal is not constant. As a result of interlinking current amplifier and impedance converter A, voltage amplifier B. amplification back-coupler D and coupler C, a compensation current can be provided at the input of the device This makes it possible when a signal current of the signal current source Q is present, to minimize the voltage swing at the input of the device in such a way that non-ideal components of the signal-current source Q to a large extent have no effect. Such non-ideal components of the signal current source Q can exist due to a characteristic with ohmic-capacitive effect which depends on charge carrier and space charge, which narrows the useable bandwidth.

From a threshold that can be set, the signal swing limiter E arranged parallel to the amplification back-coupler D feeds back its control current to the input of the current amplifier and impedance converter A in such a way, by way of coupler C, as to limit the voltage swing at the terminals of the non-ideal signal current source Q which occurs with larger currents. In this way, overloading is prevented and thus the effect of the non-ideal components of the signal current source is minimized.

Basically, the signal swing limiter E corresponds to the amplification back-coupler D with a different inception threshold and a stronger current feedback resulting in a lower amplification of the circuit.

The third functional block, by way of which feedback takes place, is the operating-point setting device F for stabilizing and adjusting the operating point of the device across the entire temperature range. Such a unit is necessary because the device comprises real components with temperature-dependent parameters so that temperature influences have to be compensated for.

Figure 2:
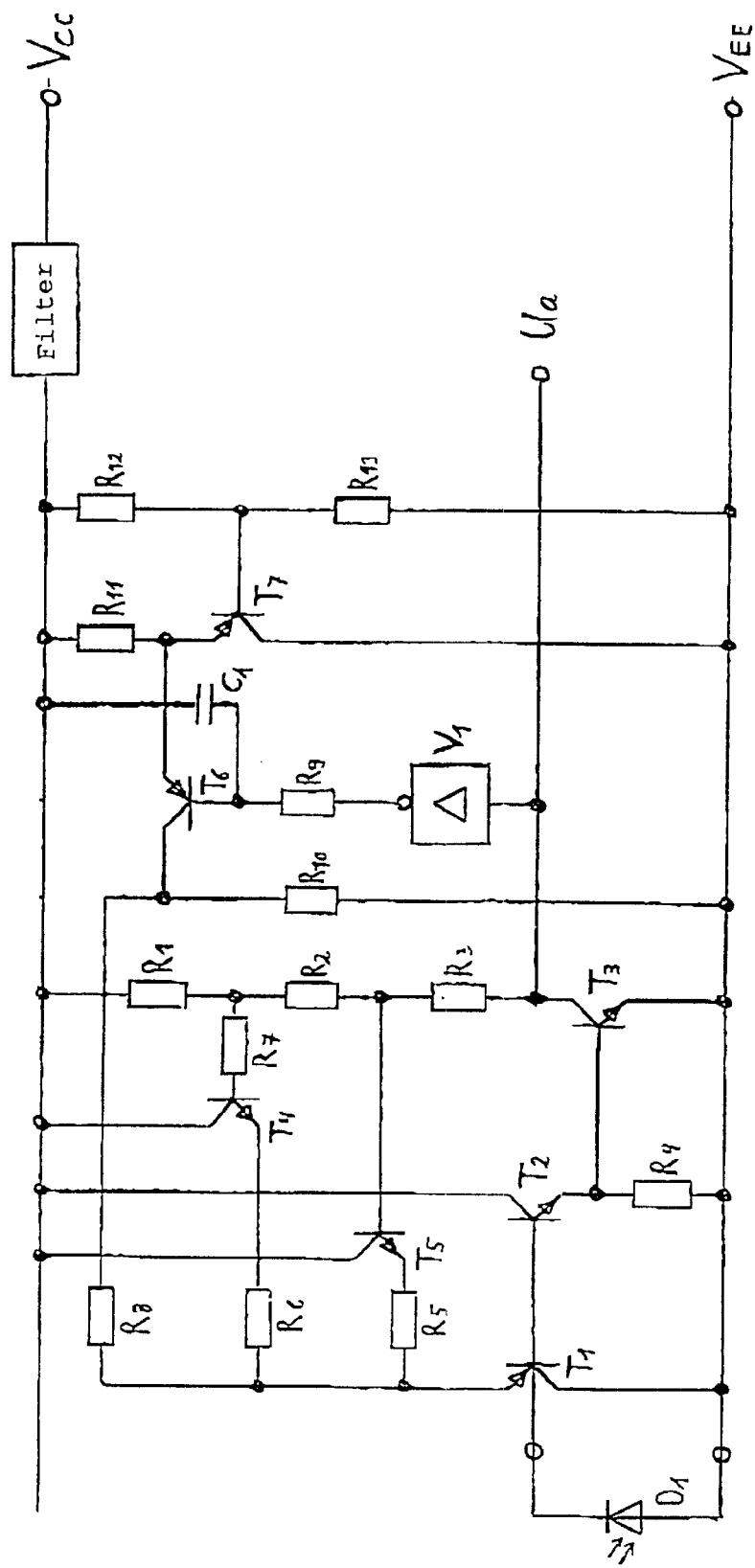
FIG. 2 is a preferred circuit-engineering realization of the embodiment of FIG. 1.

FIG. 2 shows a preferred circuit-engineering realization of the individual functional blocks A, B, C, D, E, F, Q of the embodiment of FIG. 1 of the device according to the invention.

The non-ideal source of current Q from FIG. 1 is provided by a photodiode D1.

The current amplifier connected to the source of current Q is realized by an NPN emitter follower T2 and the impedance converter is realized by a resistor R4.

Connected to the output of the current amplifier A is a voltage amplifier B which is realized by a simple NPN transistor T3 in the emitter circuit and comprises a voltage divider made from resistors R1, R2, R3.

The coupler C from FIG. 1 comprising a PNP transistor T1, as a reverse-operated emitter follower, is switched directly with its base to the input of the device.

An TPN transistor T4 is connected in a collector circuit across the resistor R1 of the voltage divider of the voltage amplifier B by way of a series resistor R7, with the said NPN transistor T4 being connected to the emitter of the transistor of the coupler C by way of a further resistor R6.

For the signal swing limiter E from FIG. 1 an NPN transistor T5 is, in a collector circuit, directly connected between the resistors R2 and R3 of the voltage divider at the output of the voltage amplifier B. The emitter of the transistor T5 is connected to the emitter of the transistor of the coupler C via a resistor R5.

For the functional block operating-point setting device/temperature drift compensator F of FIG. 1, an inverting amplifier V1 is connected to the collector of the transistor T3 of the voltage amplifier B. The output of the amplifier V1 in turn is connected to the base of a PNP transistor T6 via a low pass R9, C1. The collector of the transistor T6 on the one hand comprises a collector resistor R1, and on the other hand is connected to the emitter of the transistor T1 of the coupler C, via a resistor R8.

The base of a PNP transistor T7 used as an auxiliary voltage source is connected to a voltage divider at which the supply voltage Vcc is present, between its resistors R12 and R13. The transistor T7 comprises an emitter resistor R11 which at the same time is the emitter resistor R11 of the transistor T6.

The device operates as follows:

The photodiode D1 supplies very small currents to the current amplifier and impedance converter A. The current is amplified by way of NPN emitter follower T2 and impedance matching to the subsequent current-controlled voltage amplifier B is carried out by the resistor R4.

The transistor T3 of the voltage amplifier B forms a signal voltage from the current which it applies to the output of the device and which it inverts and images with amplification at the output resistors R1, R2, R3.

By way of resistor R6, the amplification back-coupler D feeds a current, depending on the voltage present at the voltage divider of the voltage amplifier B, to the input of the coupler C. By its conductance, the amplification back-coupler D determines the dynamic equilibrium state, i.e. the equilibrium state of the circuit which can be influenced by an input signal, as well as determining its amplification. In this, setting the amplification of the device is both via the voltage divider R1, R2, R3 and via the series resistor R7. At the same time, as a result of its design, the amplification back-coupler D causes minimal load of the output signal and furnishes an easily manageable large feedback current.

The signal swing limiter E functions in the same way as the amplification back-coupler D. Its operating point is however set in such a way that it commences later than the amplification back-coupler D. Amplification of the circuit is reduced by the signal swing limiter E to such an extent that overloading the circuit is avoided within a large range in that the transistor T5 via R5 feeds a current to the input of the coupler C when its base emitter voltage is exceeded.

The operating-point setting device/temperature drift compensator F is used for setting the static operating point, i.e. the operating point which does not depend on the useful signal, for application-dependent sequence circuits as well as to compensate for the drift of this operating point as a result of temperature influence. Taking into account temperature influence is required above all due to the semiconductor junctions T1, T2, T3, T4 arranged in a chain which all cause a drift of the operating point in the same direction.

To determine the operating point, the temperature-dependent output signal Ua of the voltage amplifier B is inverted and averaged, with this average value with increased amplitude being used as a reference for the rest state. The operating point of the device is then set by a temperature-controlled direct-current coupling to the coupler of the control currents C.

To this purpose the inverting amplifier V1 images the output signal by way of the low pass R9, C1 to the base of the transistor T6, as an averaged reference voltage. The reference voltage then applies a direct voltage at the collector resistor R10, which direct voltage feeds the current necessary for the equilibrium state to the coupler C. To compensate for the temperature influence of the transistor T6, at its emitter, i.e. at the resistor R11, the transistor T7 provides an auxiliary voltage corresponding to the setting of the voltage divider R12/R13.

The small control currents to be fed to the input of the device, amplified by the blocks D, E, F, are applied to the emitter of the PNP transistor T1 via the resistors R5, R6, R8 and are imaged to the input with the reciprocal value 1/B of the current amplification B of the transistor T1. This additionally leads to all disturbing parasitic capacities with large currents being quickly re-charged and all disturbing currents only having an effect on the sensitive input with the reciprocal value 1/B of the current amplification of the transistor T1.

Figure 3:
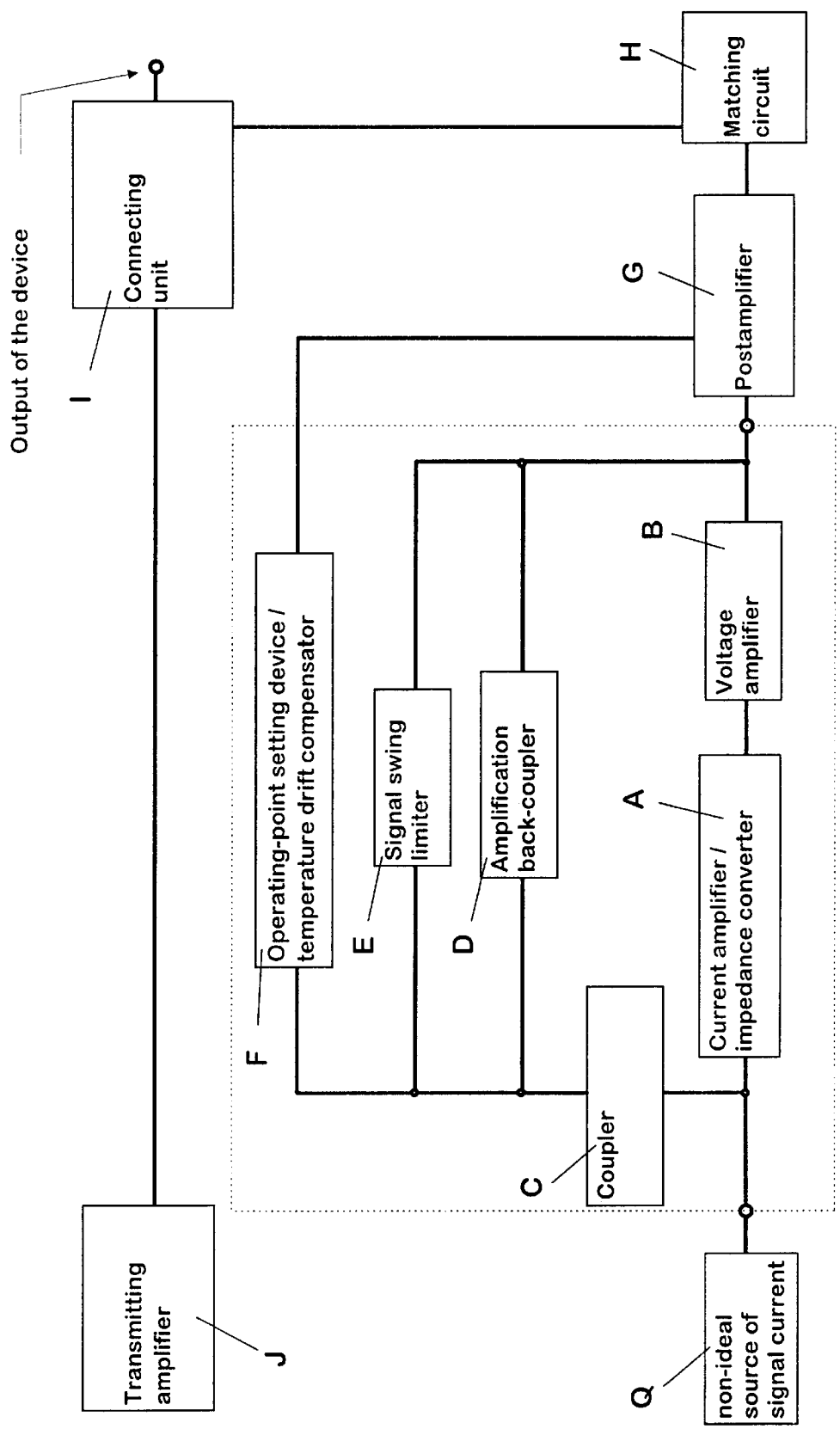
FIG. 3 is a block diagram of a second embodiment according to the invention.

A second embodiment in which the device is to be used for a "10 Base T" application is shown as a block diagram in FIG. 3.

Apart from the functional blocks of FIG. 1, the embodiment of FIG. 3 comprises a postamplifier G, a matching circuit H and a connecting unit I connected in series. The postamplifier G is connected to the output of the voltage amplifier and the connecting unit I is connected to the output of the entire device and thus in this case to a "10 Base T" application. In addition, the connecting unit I is connected to a transmitting amplifier J. In contrast to FIG. 1, in this case feedback is via an operating-point setting device/temperature compensator F, not directly from the output of the voltage amplifier, but only from an output of the postamplifier G.

The function of blocks A–F has already been described in connection with FIG. 1, consequently only the details of the addition for "10 Base T" applications are discussed.

"10 Base T" applications use differential current signals for data transmission which are subject to strict balance (make-to-break ratio, absence of jitter). In addition, readiness for operation (link pulse), start of transmission and end of transmission are characterized by special signal forms. After the end of each data transmission or of each link pulse, the transmission line is switched free of current.

To be able to provide a corresponding signal, the voltage signal provided by the functional blocks A–F is first fed to the postamplifier G which at its output images a balanced signal which does not depend on the amplitude of the input signal. This is achieved in that the output signal of the input amplifier is compared with a reference voltage generated from this signal. For each amplitude of the fed-in output signal Ua, this reference voltage is half the alternating voltage component Ua.

The balanced differential voltage signal derived from the postamplifier G is subsequently fed to a matching circuit H which converts the differential voltage signal into a differential current signal via a standard driver. In this, the control signal necessary to operate a standard driver is exclusively derived from the differential voltage signal of the postamplifier G.

There are two different circuit set-ups for "10 Base T" applications: one for connection to a PC and another for connection to a network distributor (hub). The two connection set-ups only differ in that the inputs and outputs are transposed. The differential current signal, which in the matching circuit H is matched to "10 Base T" applications, is provided to a universal connecting unit comprising both a connection for linking it to a PC and a connection for linking it to a network distributor, so that the necessary transposition of inputs and outputs when linking it to a PC or a network distributor can take place simply by plugging the connection cable differently.

In addition, the use of the device with a "10 Base T" application requires a transmitting amplifier J for operating a light emitter such as a LED. It converts the differential input signal of the "10 Base T" application into a transmitting current for the light emitter. If no differential input signal is present, the transmitting amplifier J switches off the transmission current because in such a case a non-defined condition exists.

Possible circuit-engineering realizations of the individual functional blocks are shown in FIGS. 4–7.

Figure 4:
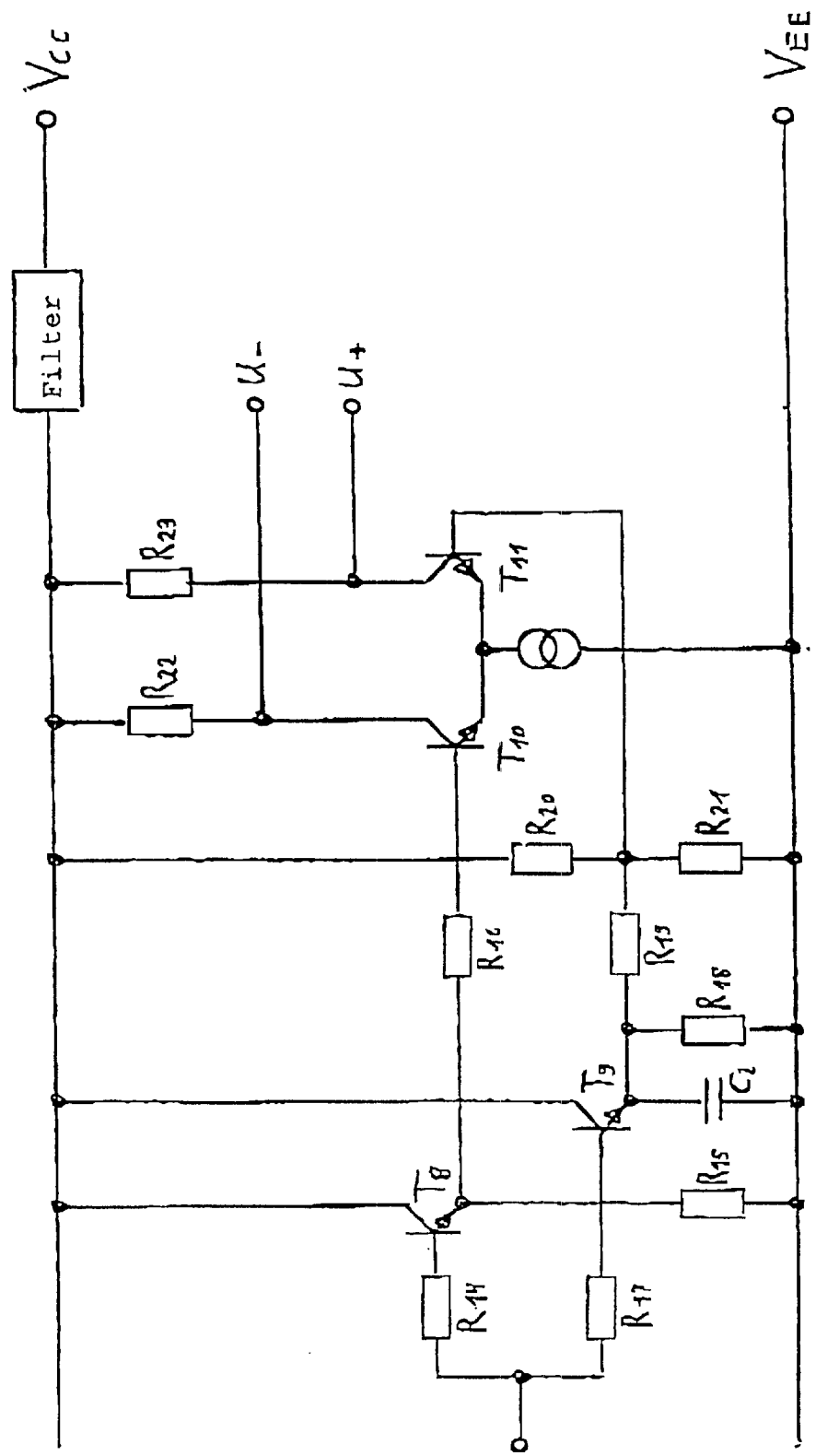
FIGS. 4–7 show options of circuit-engineering realizations of the individual functional blocks of the second embodiment of FIG. 3 which go beyond the functional blocks of the first embodiment.

FIG. 4 shows an embodiment of a postamplifier G with balancing equipment.

In the postamplifier G the output of the voltage amplifier B from FIG. 3 is on the one hand connected to a first emitter-follower circuit R14, T8, R16, and on the other hand with a second emitter-follower circuit R17, T9, R18. The first emitter-follower circuit, via its resistor R16, is connected to the inverting input of a differential amplifier with transistors T10, T11. A capacitor C2 is connected in parallel to the resistor R18 of the second emitter-follower circuit. The emitter of the transistor T9 of the second emitter-follower circuit is connected to the non-inverting input of the differential amplifier via a voltage divider R19, R20, R21.

The voltage signal provided by the voltage amplifier B is de-coupled via the two emitter-follower circuits. Via the resistor R16, a first signal is applied directly to the inverting input of the differential amplifier T10/T11. By means of the second emitter-follower circuit, in addition, a reference signal for balancing the voltage is derived. In order to form this reference signal, the capacitor C2 is charged to the maximum value of the signal voltage attained which is maintained depending on the resistors R18 to R21 (peak detection). By way of the voltage divider R19, R20, R21, the voltage at the capacitor C2 is divided in such a way that the output voltage of the divider above the resistance R21 of the voltage divider always amounts to half the alternating component of the signal voltage at the inverting input of the differential amplifier T10/T11. The reference signal generated is then applied to the non-inverting input of the differential amplifier T10/T11.

Thus a differential voltage signal is present between the collectors of the transistor T10 and the transistor T11, which differential voltage signal forms the output signal of the postamplifier G, with the output voltage of the voltage amplifier B being postamplified, and irrespective of the signal amplitude of the output voltage of the voltage amplifier B, a balanced signal with a make-to-break ratio of almost 1:1 is imaged at the differential voltage outlet.

Thus the differential voltage signal obtained is suitable for direct further processing via a standard differential voltage amplifier.

Figure 5:
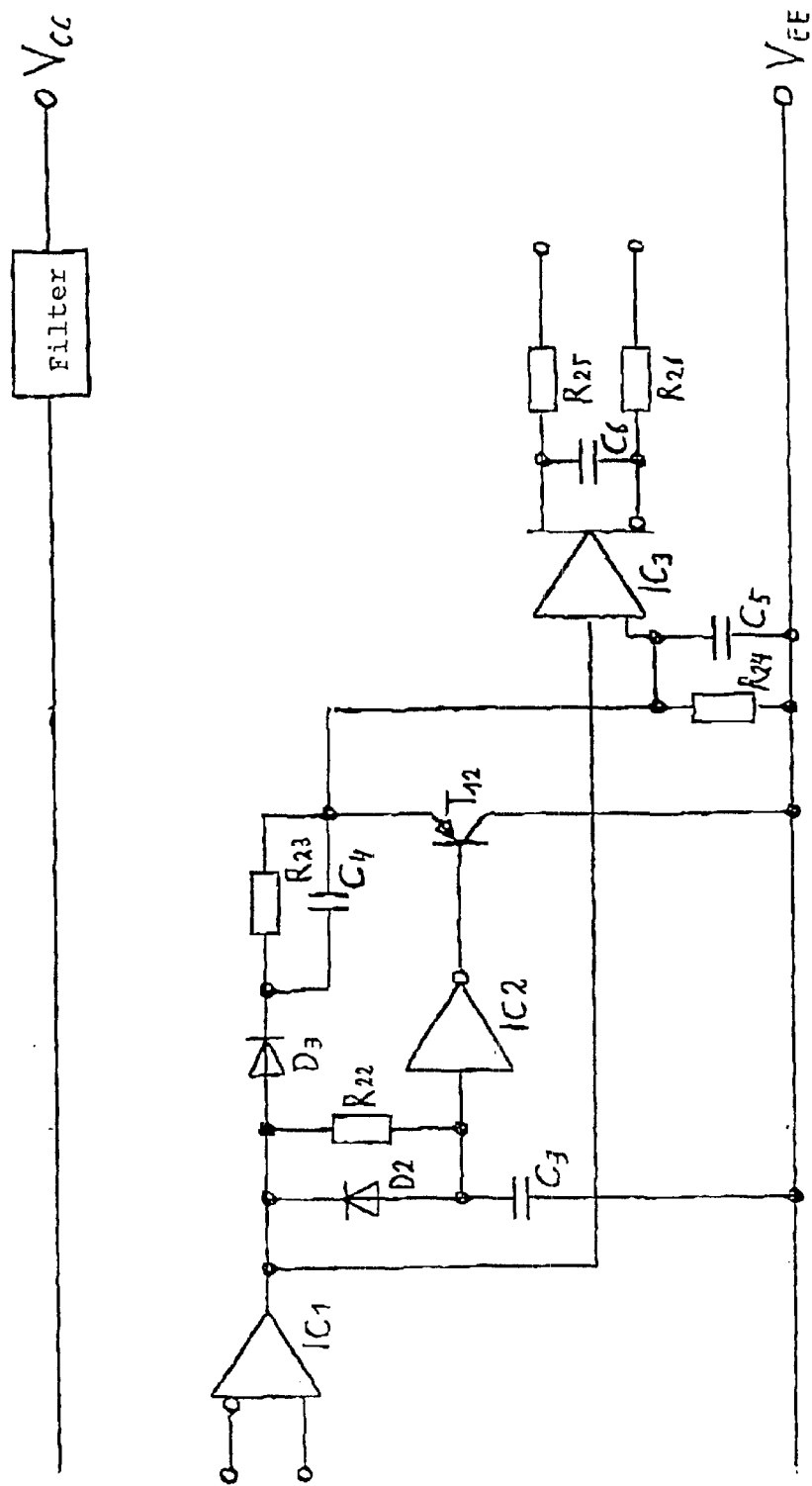

The inverting amplifier V1, shown in FIG. 2, can alternatively also be integrated in the post amplifier G. FIG. 5 shows an embodiment of a matching circuit H for "10 Base T" applications with control logic.

At the input of the matching circuit H, the differential voltage output of the postamplifier G is connected to an IC1. The output of the IC1 is connected to the signal input of a driver component IC3. In addition, the output of the IC1 is connected as a switch-on circuit with the control input of the driver component IC3 via a diode D3 and a parallel circuit of a resistor R23 and a capacitor C4. Furthermore, a parallel circuit comprising a resistor R24 and a capacitor C5 is provided at the control input of the driver component IC3.

A switch-off circuit for the driver component IC3 is formed by a transistor 12 connected to a diode D2, a resistor R22 and a capacitor C3 via an inverting gate IC2.

The output of the driver component IC3 is provided with a circuit comprising a capacitor C6 and resistors R25, R26, forming the output of the matching circuit H.

Matching of the differential voltage signal of the postamplifier G to the differential current signals necessary for "10 Base T" applications is via a standard driver. The control signal for release, i.e. for terminating and restoring the high-ohmic condition (tri state) before and after data transmission, is also derived from the differential voltage signal of the postamplifier G.

To this purpose the differential voltage signal from the postamplifier G is converted into a TTL signal via IC1, with the TTL signal being directly switched to the signal input of the driver component IC3. By way of D3, C4 and R23, the control input of IC3 is switched to the TTL output signal of IC1 in such a way that the logical state "1" immediately switches the differential current outputs of IC3 to the low-ohmic state. Via elements R24 and C5 a time is set to ensure that the driver component IC3 safely doesn't "switch off" during data transmission, even in the logical state "0". Only after an extended logical state "0" is the capacitor C5 discharged sufficiently for IC3 to fall back to the high-ohmic state.

To ensure safe switching off of IC3 at the end of a transmission, the driver IC3 must be switched off after a defined period of time, even after extended logical state "1". This is achieved in that after the time set with R22 and C3, the inverting gate JC2 switches to logical "0" resulting in the driver component IC3 being switched off via T12. D2 is used to discharge C3.

Switching of the driver component IC3 with C6, R25 and R26 is used to match the differential outputs of the driver IC3 to the "10 Base T" connection.

Figure 6:
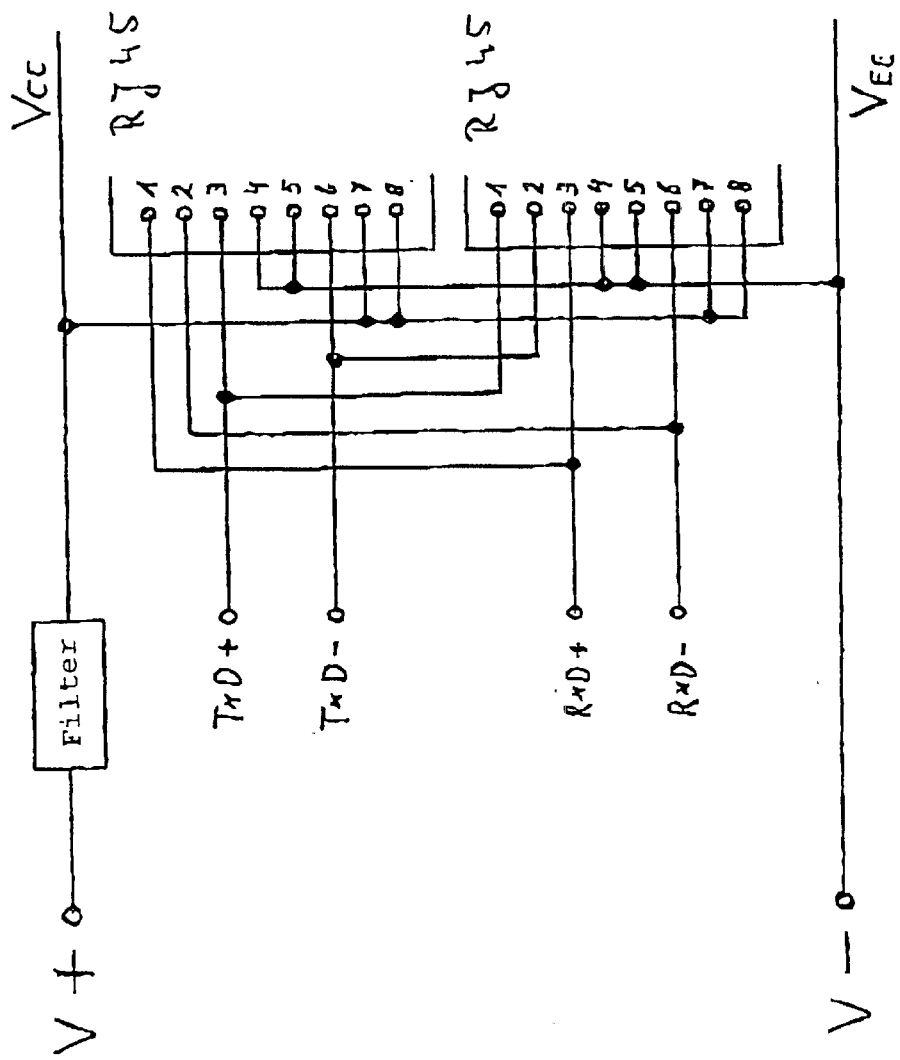

FIG. 6 shows a preferred embodiment of a connecting unit I from FIG. 3.

The connecting unit I comprises two RJ45 connectors (plug and socket), each comprising eight pins 1–8. In both connectors, pins 4, 5, 7, 8 are connected to the voltage supply cables of the device. Pins 1 and 2 of the first connector and pins 3 and 6 of the second connector are connected to the output of the matching circuit H of FIG. 3. The input of the transmitting amplifier J of FIG. 3 is connected in exactly the opposite way with the connectors, i.e. with pin 3 and 6 of the first connector and pins 1 and 2 of the second connector.

For universal use of the device according to the invention using existing RJ45 connectors, two types of connections must be provided: one for connection to a PC and another for connection to a network distributor. The two types of connectors only differ in that the wiring of the inputs and outputs at the RJ45 are the other way round. In the embodiment of FIG. 6, two RJ45 connectors are provided which are switched with each other in such a way that the inputs and outputs of the device are changed over simply by changing the plugging in of the RJ45 connection cables.

In addition, the free RJ45 connector is used to supply the electricity necessary for operation, to the device according to the invention via the connectors 4, 5, 7 and 8 which are not used by "10 Base T" applications. Connection is by a power pack comprising an RJ45 plug and socket connector, without the need to provide an additional supply voltage input.

In the case of the connecting unit of FIG. 6 the connection to the positive supply-voltage at the connectors 7 and 8 and the connection to the mass potential at the connectors 4 and 5 of both RJ45 connectors are provided. Any other variations for connecting the free connectors 4, 5, 7 and 8 for connecting the supply voltage are also possible.

Supply of the individual switching units is via filters, so as to suppress disturbances in the supply voltage both within and outside the device.

Figure 7:
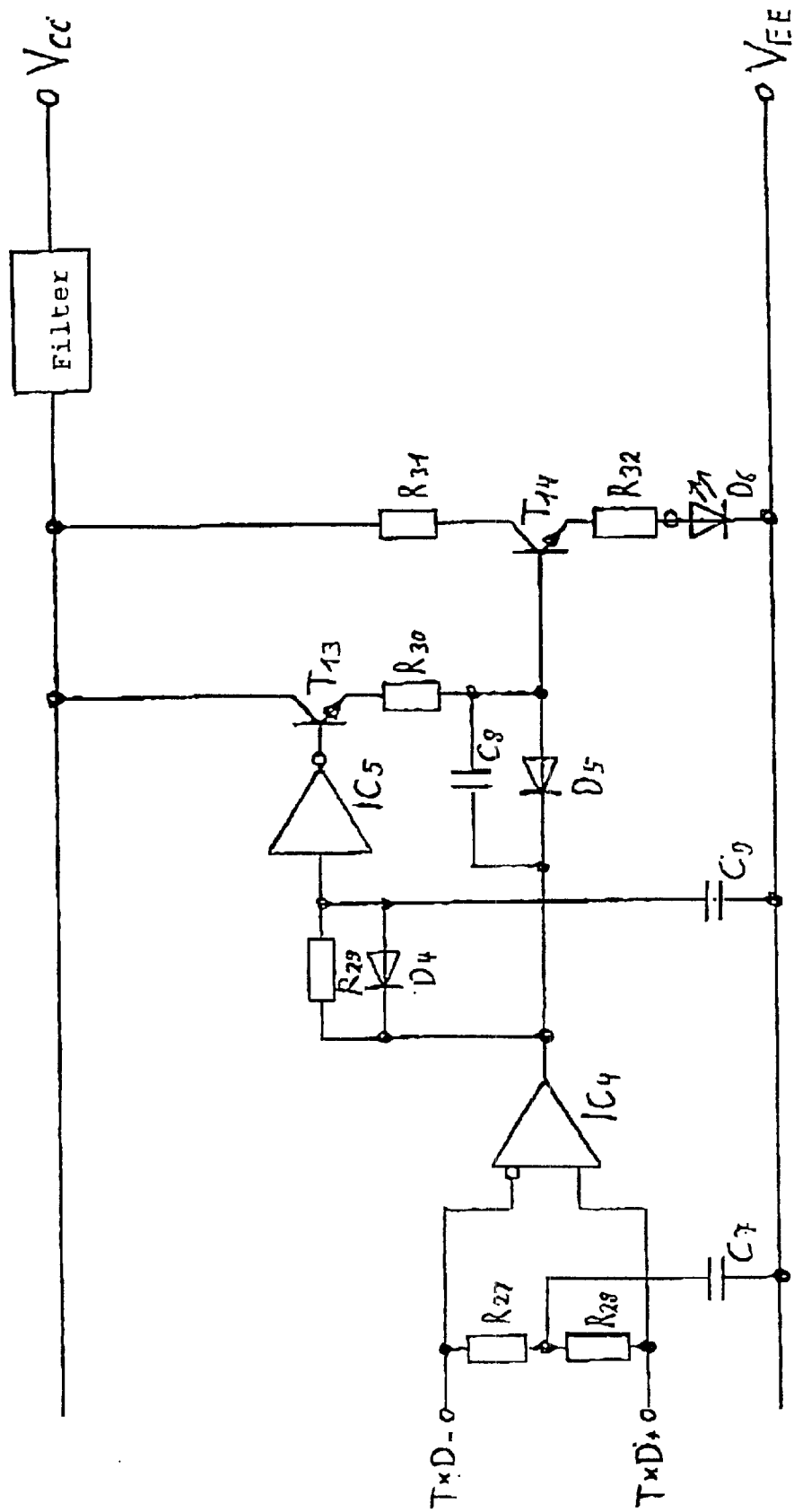

Finally, FIG. 7 shows a circuit-engineering realization of the transmitting amplifier J of FIG. 3.

To the exterior, the input of the transmitting amplifier J is connected to the respective connectors of the plug and socket connectors of the connecting unit I of FIG. 6. Within the transmitting amplifier J, the input is connected to the input of a standard component IC4 by way of resistors R27, R28 and a capacitor C7.

By way of the parallel connection of a diode D5 and a capacitor C8, the output of IC4 is present at the base of a switching transistor T14. The collector of the switching transistor T14 is connected to a resistor R31 and the emitter of the said switching transistor is connected to an emitter D6 connected in series with a further resistor R32.

With a resistor R29, a diode D4, a capacitor C9 and an inverting gate IC5, together with an emitter follower T13, R30, a timing circuit is provided at the output of IC4. In this, the emitter follower T13, R30 is also connected to the base of the switching transistor T14.

The transmission amplifier J with automatic switchoff device is used to convert the differential input signal of a "10 Base T" application into a current necessary to operate a light emitter (LED). At the same time it ensures that if no differential input signal is present due to an application which has been switched off or hasn't been connected, the light emitter is switched off. This automatic switchoff device is necessary because with the use of standard components for converting the differential input signal into a TTL signal, non-defined conditions result if no differential input signal is present at the TTL output.

Decoupling of the differential input signal of a "10 Base T" application takes place by way of the standard component IC4 switched via R27, R28 and C7. By way of D5 and C8, the TTL output of the IC4 controls the base of the switching transistor T14 and thus by way of R31 and R32 the IC4 controls the necessary current to operate emitter D6. During normal operation, the base of T14 obtains its positive current via the emitter follower T13 and R30. If however in the non-defined state the TTL output of IC4 switches to logical "1", then after a period of time which can be set by R29 and C9, the output of the inverting gate IC5 drops to logical "0", resulting in the base current being switched off via T13. Via T4 this switch-off state is immediately terminated as soon as the first logical "0" is present at the TTL output of IC4.

What is claimed is:

1. A device for converting low currents applied by a non-ideal current source to an input of the device into voltage signals, comprises:

a converter for converting the low currents into voltage signals, at least one feedback branch, and a coupler, wherein an output of the converter is fed back to an input of the converter over the at least one feedback branch and the coupler, and wherein the coupler is wired so that control currents supplied by the at least one feedback branch are applied to the input of the converter via the coupler to control the low currents applied by the non-ideal current source at the input of the device, and wherein the control currents are applied to the input of the converter via the coupler thereby providing a reduction of capacitive, inductive and ohmic influence of the at least one feedback branch and an amplitude matching of the control currents.

2. The device according to claim 1, wherein the converter comprises a current amplifier, an impedance converters and an inverting voltage amplifier.

3. The device according to claim 2, wherein the at least one feedback branch comprises a gain feedback device for adjusting a gain of the inverting voltage amplifier and for compensation of effects of non-ideal components of the current source in the input low currents.

4. The device according to claim 1, wherein one of the feedback branches comprises a working point adjuster for adjusting a working point of the device with temperature drift compensation for compensation of temperature effects on the non-ideal components.

5. The device according to claim 3, wherein one of the feedback branches comprises a signal stroke limiter for reducing the gain of the device and for limiting signal stroke at the input of the device, wherein a threshold for use of an effect of the signal stroke limiter starts later than the gain feedback device.

6. The device according to claim 5, wherein a starting threshold of the signal stroke limiter is adjustable.

7. The device according to claim 1, wherein the coupler comprises a transistor.

8. The device according to claim 1, wherein the coupler comprises a PNP transistor wired as a reverse operated emitter follower whose base is connected to the input of the converter.

9. The device according to claim 1, wherein the non-ideal current source is a photodiode.

10. The device according to claim 1, wherein the converter, the coupler, and the at least one feedback paths comprise NPN transistors, PNP transistors, field effect transistors or combinations thereof.

11. The device according to claim 1, for use with a 10 base T application, wherein, the output of the converter is connected over a post-amplifier to a differential voltage output for output of a symmetrical signal, an adaptor circuit for 10 base T applications for converting the differential voltage signal into a differential current signal, and a terminal unit for RJ45 base with an option of connection to a PC or a network distributor, to the output of the device, wherein the terminal unit is further connected to a transmission amplifier, for conversion of a differential input signal of the 10 base T application to a transmission current for a light emitter.

12. The device according to claim 11, wherein a working point adjuster is connected from an output of the post-amplifier, over the coupler, to the input of the converter, for adjusting the working point with temperature drift compensation.

13. The device according to claim 11, wherein the transmission amplifier comprises means for automatic shutdown when the 10 base T application is not connected or not running.

14. The device according to claim 11, wherein the terminal unit comprises at least two RJ45 terminal connections, wherein terminals not needed for the 10 base T application are connected to power supply lines of the device to permit a power supply to the device over the terminals.

* * * * *